United States Patent
Sakiyama et al.

(10) Patent No.: US 7,920,002 B2
(45) Date of Patent: Apr. 5, 2011

(54) PULSE SYNTHESIS CIRCUIT

(75) Inventors: Shiro Sakiyama, Kyoto (JP); Yusuke Tokunaga, Hyogo (JP); Shiro Dosho, Osaka (JP); Akinori Matsumoto, Osaka (JP); Takashi Morie, Osaka (JP); Kazuaki Sogawa, Osaka (JP); Yukihiro Sasagawa, Osaka (JP); Masaya Sumita, Hyogo (JP)

(73) Assignee: Panasonic Corporation, Osaka (JP)

( * ) Notice: Subject to any disclaimer, the term of this patent is extended or adjusted under 35 U.S.C. 154(b) by 193 days.

(21) Appl. No.: 12/133,901

(22) Filed: Jun. 5, 2008

(65) Prior Publication Data
US 2008/0315933 A1    Dec. 25, 2008

(30) Foreign Application Priority Data
Jun. 20, 2007 (JP) .................... 2007-162737

(51) Int. Cl.
*H03K 5/01* (2006.01)
(52) U.S. Cl. ............... 327/166; 327/298; 327/107
(58) Field of Classification Search .......... 327/107, 327/164, 166
See application file for complete search history.

(56) References Cited

U.S. PATENT DOCUMENTS

| 4,797,586 | A | * | 1/1989 | Traa | 327/276 |
| 5,148,162 | A | * | 9/1992 | Crosby | 341/122 |
| 5,434,523 | A | * | 7/1995 | Sundstrom | 327/172 |
| 5,742,192 | A | * | 4/1998 | Banik | 327/166 |
| 6,275,082 | B1 | * | 8/2001 | Kiehl et al. | 327/205 |
| 6,624,688 | B2 | * | 9/2003 | Jaussi et al. | 327/552 |
| 2005/0146370 | A1 | * | 7/2005 | Hsu et al. | 327/333 |

FOREIGN PATENT DOCUMENTS

| JP | 05-083089 | 4/1993 |
| JP | 2001-209454 | 8/2001 |

* cited by examiner

*Primary Examiner* — Lincoln Donovan
*Assistant Examiner* — Ryan C Jager
(74) *Attorney, Agent, or Firm* — McDermott Will & Emery LLP

(57) ABSTRACT

A high-level period of each of n first pulse signals partially or wholly overlaps a period during which all of n second pulse signals are at the low level. A high-level period of each of the n second pulse signals partially or wholly overlaps a period during which all of the n first pulse signals are at the low level. Each of n first drive transistors includes a source connected to a ground node, a drain connected to a first node, and a gate receiving a corresponding one of the first pulse signals. Each of n second drive transistors includes a source connected to the ground node, a drain connected to a second node, and a gate receiving a corresponding one of the second pulse signals. A current mirror circuit allows a current corresponding to a current flowing through the second node to flow through the first node.

16 Claims, 7 Drawing Sheets

US 7,920,002 B2

PULSE SYNTHESIS CIRCUIT

BACKGROUND OF THE INVENTION

1. Field of the Invention

The present invention relates to a circuit for synthesizing a plurality of pulse signals whose phases are different from one another.

2. Description of the Prior Art

Conventionally, clock generation circuits have been known that generate a plurality of reference clock signals having phases shifted at even intervals by using a PLL (Phase Locked Loop) and then generate an output clock signal with a desired frequency by using the reference clock signals.

In Japanese Unexamined Patent Application Publication No. 5-83089 (Patent Document 1), a plurality of reference clock signals are generated, n AND circuits are each supplied with any two of the reference clock signals to generate n pulse signals (n is an integer equal to or greater than 2), and the n pulse signals are synthesized by a wired-OR circuit to generate a desired clock signal.

In Japanese Unexamined Patent Application Publication No. 2001-209454 (Patent Document 2), a plurality of reference clock signals are generated, n flip-flops are each supplied with any two of the reference clock signals to generate n pulse signals, and the n pulse signals are synthesized by a wired-OR circuit to generate a desired clock signal.

Thus, in the conventional techniques, n pulse signals are synthesized by a wired-OR circuit. The wired-OR circuit is generally formed by combining a plurality of logical elements. In an example of synthesizing five pulse signals, the wired-OR circuit has an OR circuit outputting the OR of two of the pulse signals, an OR circuit outputting the OR of three of the pulse signals, and an AND circuit outputting the AND of the outputs of the two OR circuits.

Also, FIG. 11 of Patent Document 2 illustrates an example of a wired-OR circuit. In the wired-OR circuit, the drain of each of n nMOS transistors and the drain of a pMOS transistor are connected to an input terminal of an inverter circuit. The source of the pMOS transistor is connected to a power supply node. The source of each of the nMOS transistors is connected to a ground node. Furthermore, n pulse signals are provided to the gates of the n nMOS transistors.

SUMMARY OF THE INVENTION

In such pulse synthesis circuits, the delay amounts of n pulse signals need to be equal to one another. However, when a wired-OR circuit is formed of a plurality of logical elements, the circuit structure of the logical elements is asymmetric, and therefore, the delay amounts in OR circuits are unequal to one another. Also, in a typical two-input OR circuit, the circuit structure is asymmetric with respect to two input signals, and therefore, the delay amounts of the two input signals are unequal to each other.

In the wired-OR circuit described in Patent Document 2, although the symmetry of the circuit is secured, there is a delay difference between rising and falling of the output signal since transition of the voltage level to the high level and transition of the voltage level to the low level occur at different slew rates at the drain of the pMOS transistor.

Therefore, an object of the present invention is to provide a pulse synthesis circuit capable of securing the circuit symmetry and realizing a smaller delay difference between rising and falling of the output signal.

According to one aspect of the present invention, a pulse synthesis circuit is a circuit for synthesizing n first pulse signals and n second pulse signals whose phases are different from one another (n is an integer equal to or greater than 2). The circuit has n first drive transistors corresponding to the n first pulse signals, n second drive transistors corresponding to the n second pulse signals, and a current mirror circuit. A high-level period of each of the n first pulse signals partially or wholly overlaps a period during which all of the n second pulse signals are at the low level and a high-level period of each of the n second pulse signals partially or wholly overlaps a period during which all of the n first pulse signals are at the low level. Each of the n first drive transistors includes a source connected to a ground node, a drain connected to a first node, and a gate receiving a corresponding one of the first pulse signals. Each of the n second drive transistors includes a source connected to the ground node, a drain connected to a second node, and a gate receiving a corresponding one of the second pulse signals. The current mirror circuit includes an input terminal connected to the second node and an output terminal connected to the first node and allows a current corresponding to a current flowing through the second node to flow through the first node.

In the above-described pulse synthesis circuit, the n first drive transistors and the n second drive transistors are symmetrically arranged with respect to the n first pulse signals and the n second pulse signals. Thus, the n first pulse signals and the n second pulse signals can have equal delay amounts. The outputs of the drive transistors are synthesized by the current mirror circuit having a symmetric circuit structure. Thereby, the slew rate for the voltage level transitioning to the high level at the first node and the slew rate for the voltage level transitioning to the low level at the first node can be made almost equal and the delay difference between rising and falling of the output signal generated at the first node can be small.

Accordingly, the relative accuracy of the phase delay in each of the n first pulse signals and the n second pulse signals can be improved, and the delay difference between rising and falling of the output signal can be small.

DESCRIPTION OF THE PREFERRED EMBODIMENTS

Figure 1:
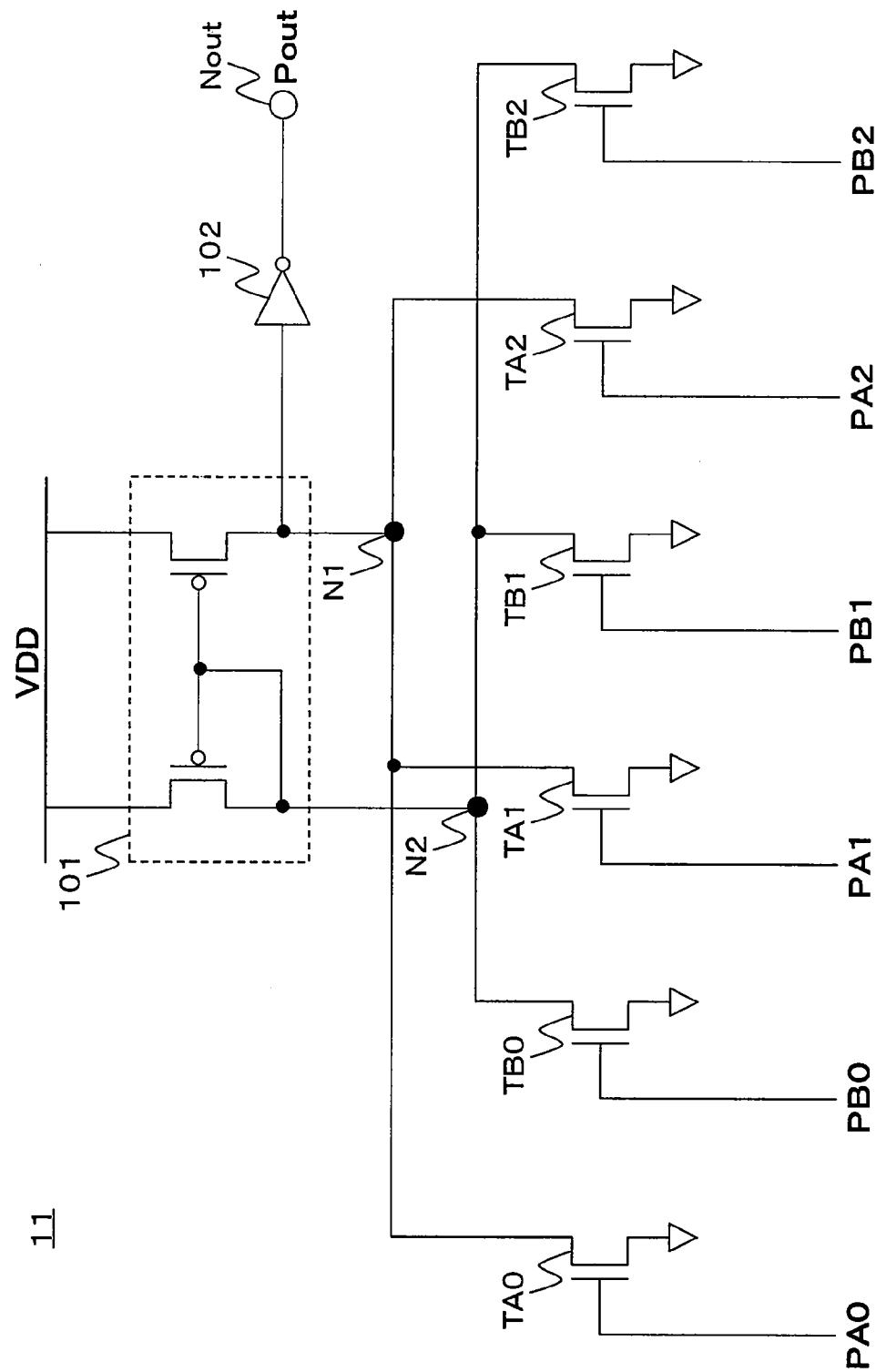
FIG. 1 shows a structure of a pulse synthesis circuit according to Embodiment 1 of the present invention.

Hereinafter, embodiments of the present invention will be described in detail with reference to the drawings. It should be noted that, throughout the drawings, the same or equivalent elements are denoted by the same reference numerals, and the descriptions thereof will not be repeated.

Embodiment 1

FIG. 1 illustrates a structure of a pulse synthesis circuit according to Embodiment 1 of the present invention. The pulse synthesis circuit 11 synthesizes n pulse signals PA0 to PA2 and n pulse signals PB0 to PB2 to output the output signal Pout (n is an integer equal to or greater than 2: in this example, n=3).

The pulse synthesis circuit 11 has drive transistors TA0 to TA2 corresponding to the pulse signals PA0 to PA2, drive transistors TB0 to TB2 corresponding to the pulse signals PB0 to PB2, a current mirror circuit 101, and an inverter circuit 102.

The sources of the drive transistors TA0 to TA2 and TB0 to TB2 are each connected to a ground node receiving a ground electric potential. The drains of the drive transistors TA0 to TA2 are each connected to a node N1, and the drains of the drive transistors TB0 to TB2 are each connected to a node N2. Furthermore, each of the drive transistors TA0 to TA2 and TB0 to TB2 is provided with a corresponding pulse signal at the gate.

An input terminal of the current mirror circuit 101 is connected to the node N2 and an output terminal of the current mirror circuit 101 is connected to the node N1. The current mirror circuit 101 allows a current corresponding to a current flowing through the input terminal to flow through the output terminal. Here, the current mirror circuit 101 is formed of two pMOS transistors that have gates coupled together. The sources of the two pMOS transistors are each connected to a power supply node receiving a supply voltage VDD. The drain of the pMOS transistor on the input side is connected to the gate of the pMOS transistor on the input side and to the node N2. The drain of the pMOS transistor on the output side is connected to the node N1.

The inverter circuit 102 is connected between the node N1 and the output node Nout. The output node Nout is a node for outputting the output signal Pout.

Figure 2:
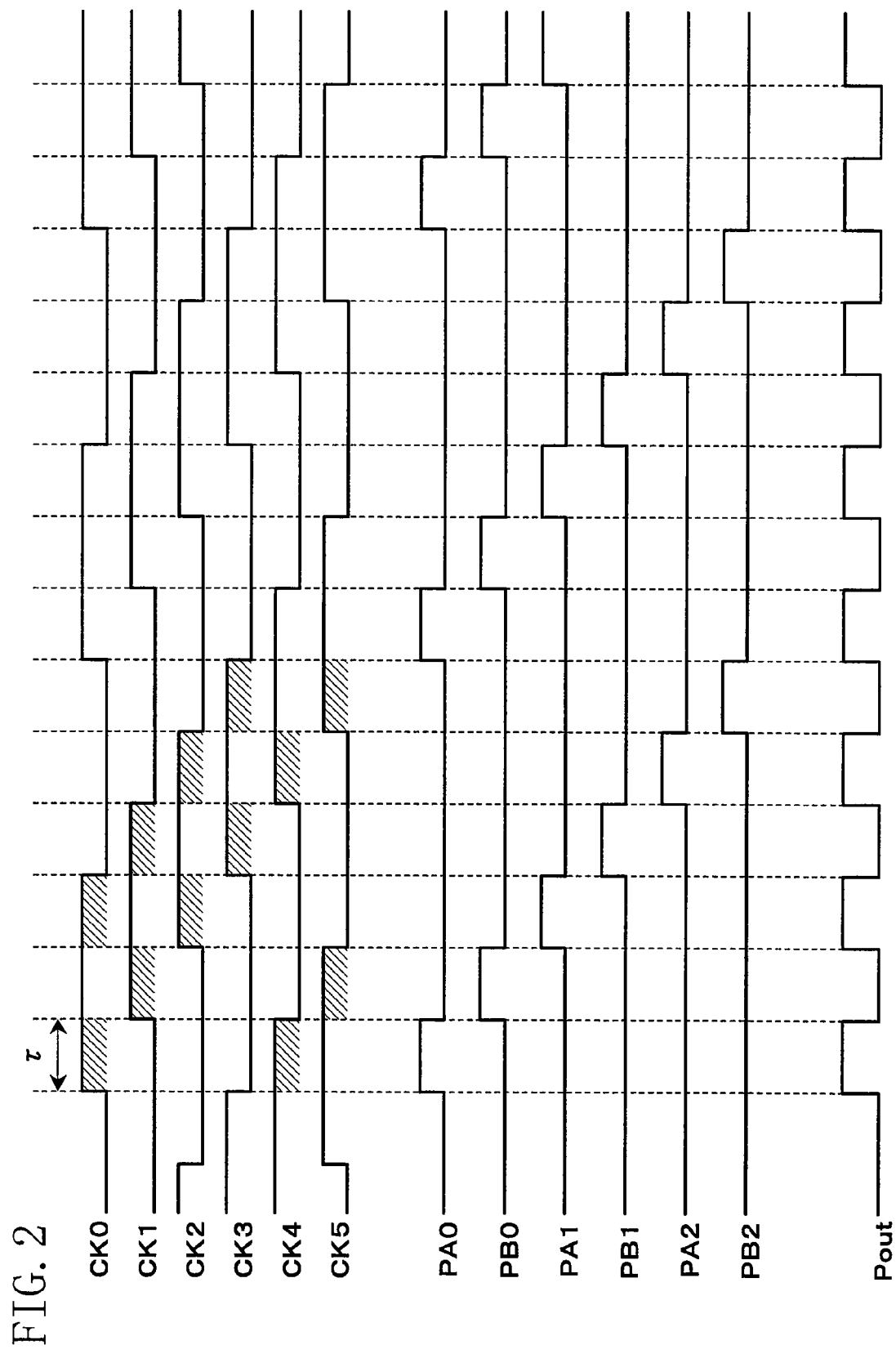
FIG. 2 is a timing chart showing signal waveforms for explaining the operations of the pulse synthesis circuit shown in FIG. 1.

The pulse signals PA0 to PA2 and PB0 to PB2 are now described. As shown in FIG. 2, the phases of the pulse signals PA0 to PA2 and PB0 to PB2 are different from one another. A high-level period of each of the pulse signals PA0 to PA2 wholly overlaps a period during which all of the pulse signals PB0 to PB2 are at the low level. A high-level period of each of the pulse signals PB0 to PB2 wholly overlaps a period during which all of the pulse signals PA0 to PA2 are at the low level. Namely, the OR of the pulse signals PB0 to PB2 is in an exclusive relation to the OR of the pulse signals PA0 to PA2. The pulse signals PA0 to PA2 and PB0 to PB2 transition from the low level to the high level in sequential order, starting from the pulse signal PA0. For example, after rising of the pulse signal PA0, the pulse signal PA0 falls and, at the same time, the pulse signal PB0 rises. Such pulse signals can be generated in accordance with reference clock signals CK0 to CK5 whose phases are equally shifted by τ. For example, supplying a two-input AND circuit with the reference clock signals CK0 and CK4 (i.e. obtaining the AND of the reference clock signals CK0 and CK4) enables to generate the pulse signal PA0. The pulse signals PA1, PA2, and PB0 to PB2 can be generated in the same way.

Referring to FIG. 2, the operations of the pulse synthesis circuit 11 shown in FIG. 1 are described below.

When any one of the pulse signals PA0 to PA2 transitions to the high level, the drive transistor corresponding to the pulse signal (for example, the drive transistor TA0) enters the ON state and a current is guided from the node N1 to the ground node. The voltage level of the node N1 thereby transitions from the high level to the low level, and accordingly, the voltage level of the output node Nout transitions to the high level (i.e. the output signal Pout rises).

When any one of the pulse signals PB0 to PB2 transitions to the high level, the drive transistor corresponding to the pulse signal (for example, the drive transistor TB0) enters the ON state and a current is guided from the node N2 to the ground node. Also, a current corresponding to a current flowing through the node N2 is supplied by the current mirror circuit 101 from the power supply node to the node N1. The voltage level of the node N1 thereby transitions from the low level to the high level, and accordingly, the voltage level of the output node Nout transitions to the low level (i.e. the output signal Pout rises).

Next, the symmetry of the circuit structure of the pulse synthesis circuit 11 shown in FIG. 1 is described. In the pulse synthesis circuit 11, the sources of the drive transistors TA0 to TA2 and TB0 to TB2 are each connected to the ground node, and the drains are each connected to the power supply node via the pMOS transistors of the current mirror circuit 101. Thus, with the symmetric arrangement of the drive transistors TA0 to TA2 and TB0 to TB2 with respect to the pulse signals PA0 to PA2 and PB0 to PB2, the pulse signals can have equal delay amounts. Specifically, the relative accuracy of the phase delay of the pulse signals PA0 to PA2 and PB0 to PB2 can be improved. Also, the outputs of the drive transistors TA0 to TA2 and TB0 to TB2 are synthesized by the current mirror circuit 101. Thereby, the slew rate for the voltage level transitioning to the high level at the node N1 and the slew rate for the voltage level transitioning to the low level at the node N1 can be made almost equal. Accordingly, the delay difference between rising and falling of the output signal Pout can be small as compared with the conventional techniques.

Embodiment 2

Figure 3:
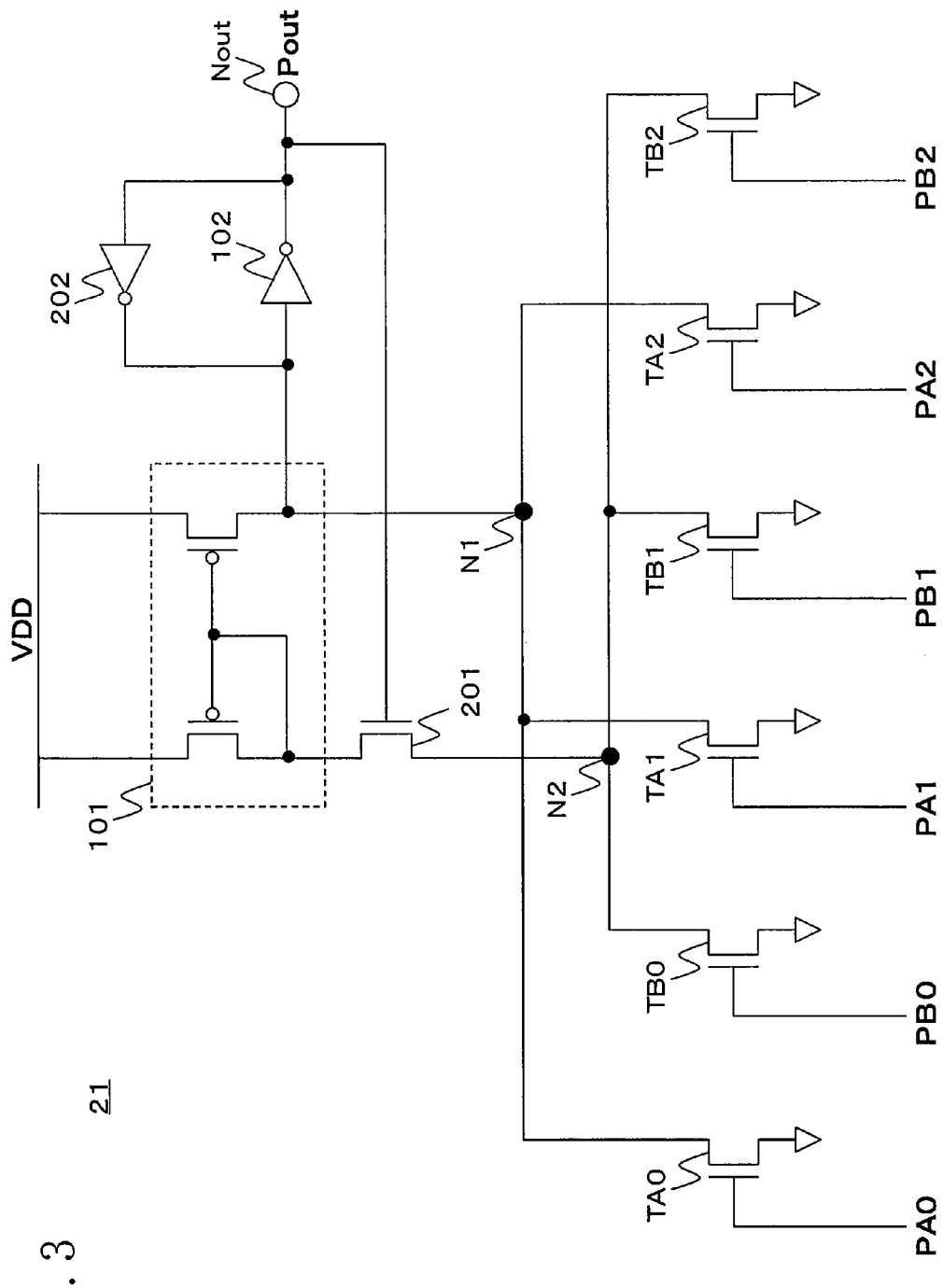
FIG. 3 shows a structure of a pulse synthesis circuit according to Embodiment 2 of the present invention.

FIG. 3 illustrates a structure of a pulse synthesis circuit according to Embodiment 2 of the present invention. The pulse synthesis circuit 21 has a switching transistor 201 and an inverter circuit 202 in addition to the structure shown in FIG. 1.

The switching transistor 201 is connected between an input terminal of a current mirror circuit 101 and a node N2 and receives the output of an inverter circuit 102 at the gate. An input terminal of the inverter circuit 202 is connected to an output terminal of the inverter circuit 102, and an output terminal of the inverter circuit 202 is connected to a node N1.

Next, the operation of the switching transistor 201 and the inverter circuit 202 shown in FIG. 3 is described.

When any one of drive transistors TB0 to TB2 enters the ON state, a current is guided from the node N2 to a ground node, and a current is supplied from a power supply node to the node N1 by the current mirror circuit 101. Thereby, the voltage level of the node N1 transitions from the low level to the high level, and the output of the inverter circuit 102 transitions from the high level to the low level. When the output of the inverter circuit 102 transitions to the low level, the switching transistor 201 enters the OFF state. Thus, after the voltage level of the node N1 transitions to the high level, a current does not flow from the input terminal of the current mirror circuit 101 via the node N2 to the ground node. Accordingly, a stationary current flowing in the current mirror circuit 101 when the drive transistors TB0 to TB2 enter the ON state can be reduced and power consumption can be lowered as well.

When the output of the inverter circuit 102 transitions to the low level, the output of the inverter circuit 202 transitions to the high level and the high-level output is supplied to the node N1 by the inverter circuit 202. Hence, even when the switching transistor 201 enters the OFF state and the node N1 enters the floating state, the voltage level of the node N1 can be held at the high level. Accordingly, the floating problem can be solved and the voltage level of the node N1 can be made stable.

Figure 4:
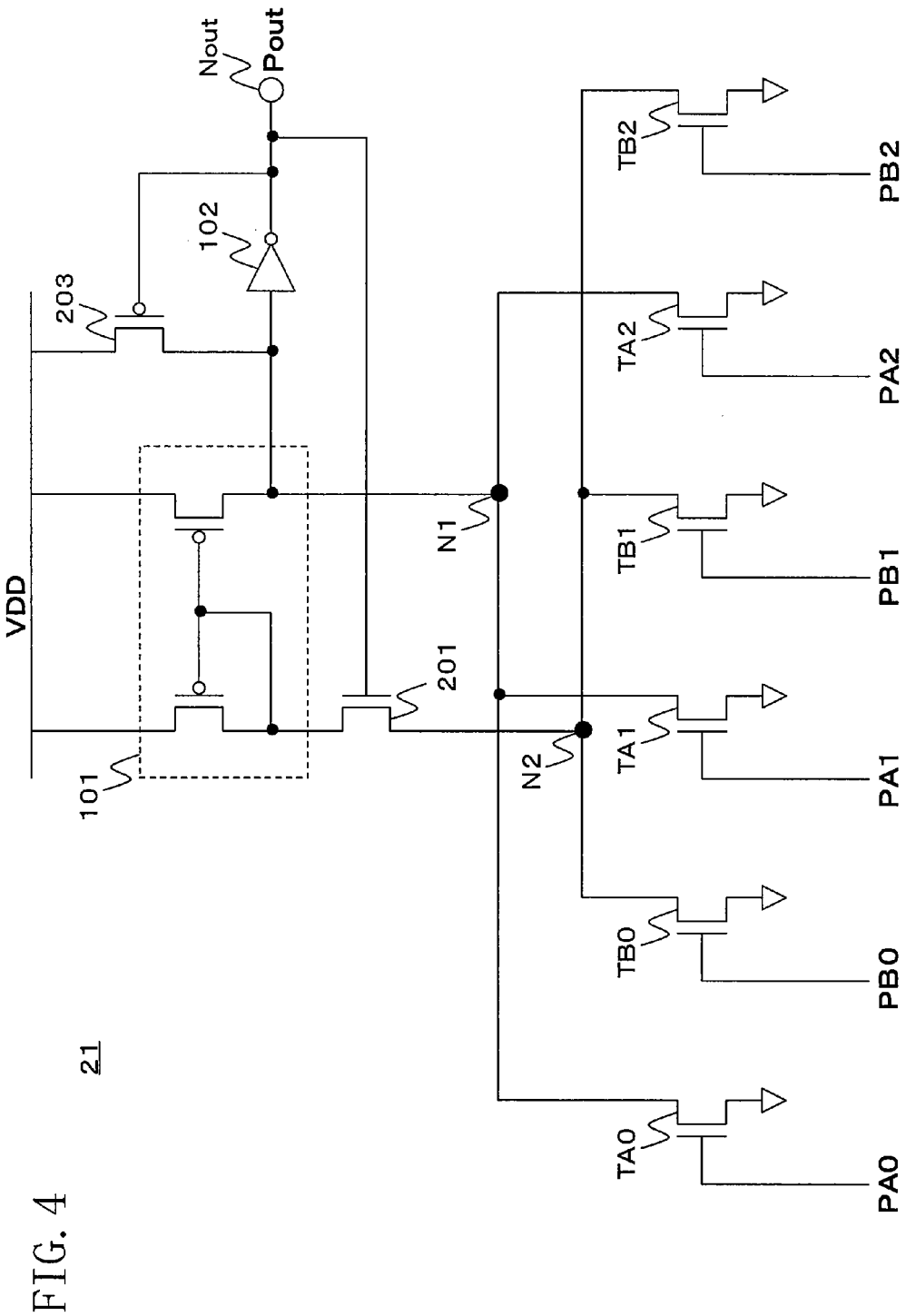
FIG. 4 shows a variation of the pulse synthesis circuit shown in FIG. 3.

The pulse synthesis circuit 21 may have a transistor 203 instead of the inverter circuit 202 as shown in FIG. 4. The transistor 203 is connected between the power supply node and the node N1 and receives the output of the inverter circuit 102 at the gate. When the output of the inverter circuit 102 transitions to the low level, the transistor 203 enters the ON state, and therefore, the voltage level of the node N1 can be held at the high level.

Figure 5:
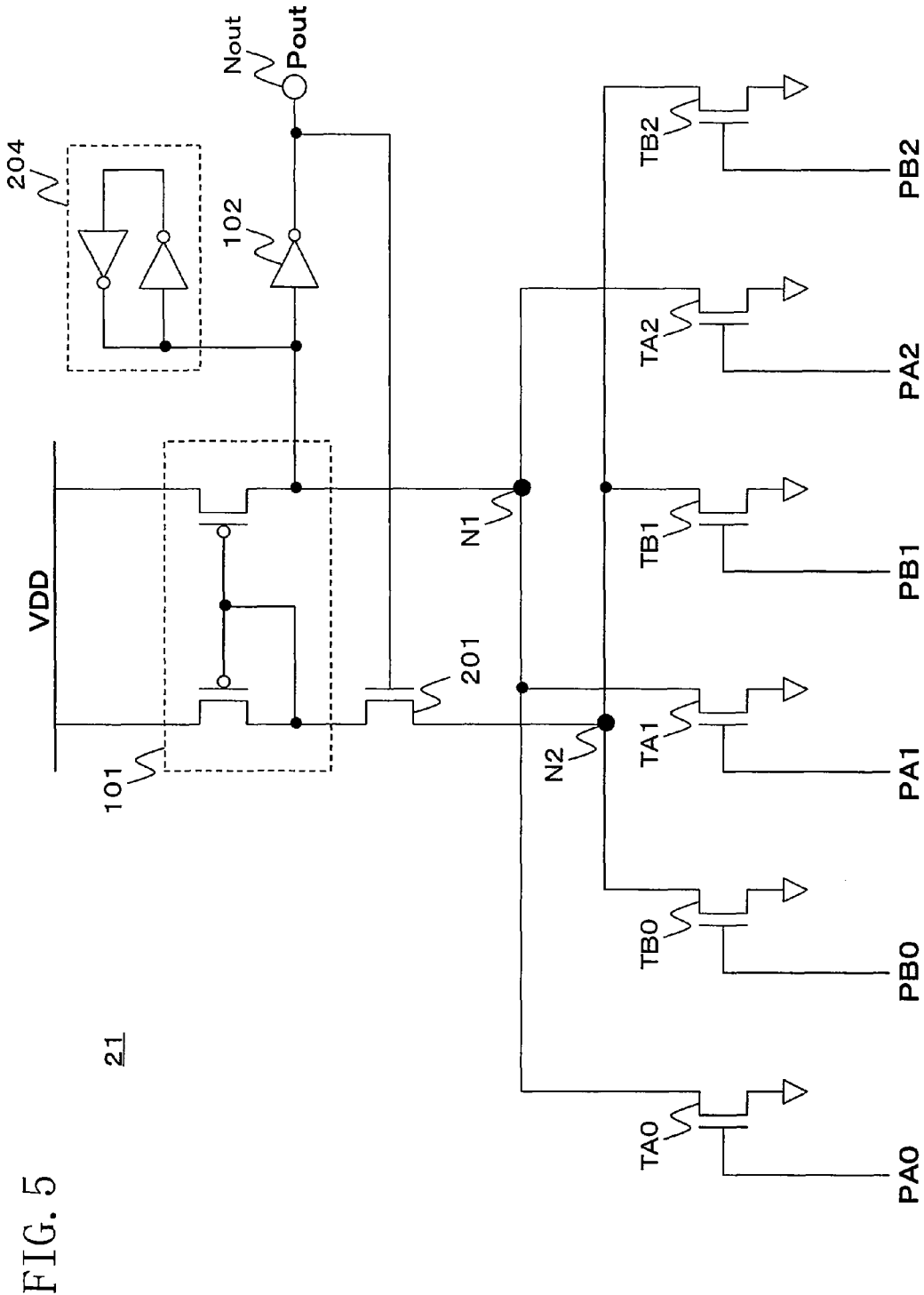
FIG. 5 shows another variation of the pulse synthesis circuit shown in FIG. 3.

Alternatively, the pulse synthesis circuit 21 may have a memory circuit 204 instead of the inverter circuit 202 as shown in FIG. 5. Even in this case, the voltage level of the node N1 can be made stable.

Figure 6:
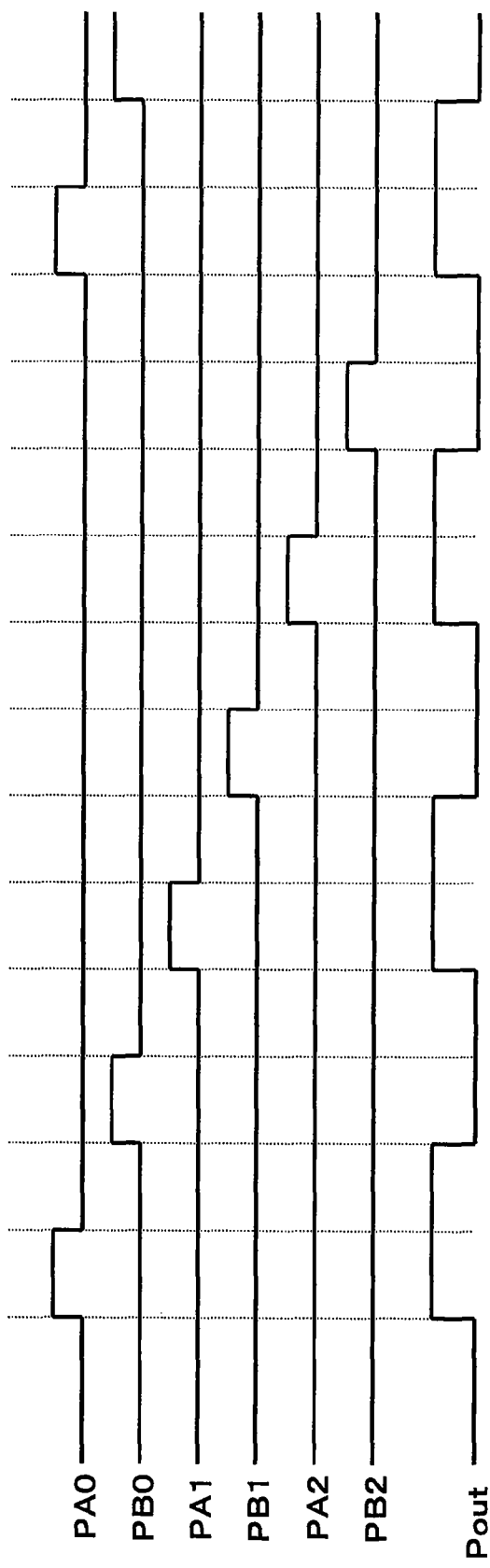
FIG. 6 is a timing chart showing signal waveforms for explaining an example of non-overlapping pulse signals.
Figure 7:
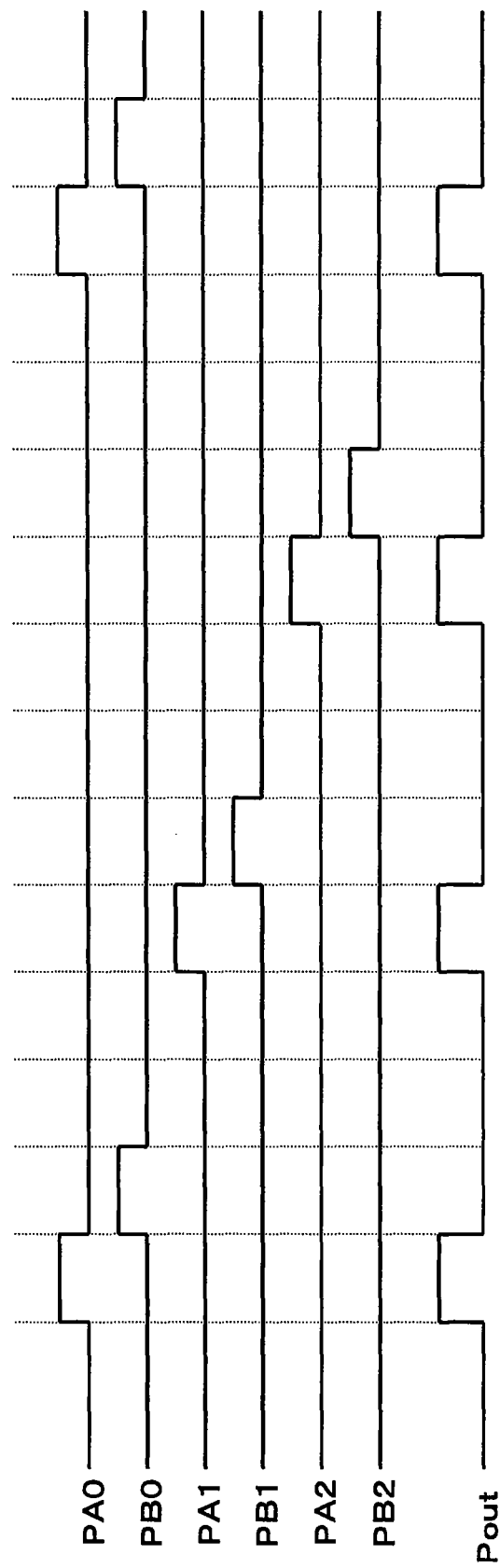
FIG. 7 is a timing chart showing signal waveforms for explaining another example of non-overlapping pulse signals.

As described in each of the foregoing embodiments, the OR of the pulse signals PA0 to PA2 and the OR of the pulse signals PB0 to PB2 are in an exclusive relation. However, as shown in FIG. 6 and FIG. 7, when each of the pulse signals PA0 to PA2 and PB0 to PB2 is in the "non-overlapping" state (i.e. when a high-level period of each of the pulse signals PA0 to PA2 and PB0 to PB2 does not overlap a high-level period of the other pulse signals), the output signal Pout can be generated. In the examples of FIG. 6 and FIG. 7, a high-level period of each of the pulse signals PA0 to PA2 partially overlaps a period during which all of the pulse signals PB0 to PB2 are at the low level. A high-level period of each of the pulse signals PB0 to PB2 partially overlaps a period during which all of the pulse signals PA0 to PA2 are at the low level.

As described above, the pulse synthesis circuit of the present invention can make the delay difference between rising and falling of the output signal smaller while securing the relative accuracy of the phase delay of the pulse signals. Therefore, it is useful, for example, as a pulse synthesis circuit used for a clock generation circuit generating an output clock signal with a desired frequency in accordance with a plurality of reference clock signals whose phases are equally shifted by τ.

What is claimed is:

1. A pulse synthesis circuit for synthesizing n first pulse signals and n second pulse signals whose phases are different from one another where n is an integer equal to or greater than 2, comprising:
   n first drive transistors corresponding to the n first pulse signals;
   n second drive transistors corresponding to the n second pulse signals; and
   a current mirror circuit,
   wherein a high level period of each of the n first pulse signals does not overlap any high level periods of the n second pulse signals,
   each of the n first drive transistors includes a source connected to a ground node, a drain connected to a first node, and a gate receiving a corresponding one of the first pulse signals,
   each of the n second drive transistors includes a source connected to the ground node, a drain connected to a second node, and a gate receiving a corresponding one of the second pulse signals, and
   the current mirror circuit includes an input terminal connected to the second node, and an output terminal connected to the first node, the current mirror circuit allowing a current corresponding to a current flowing through the second node to flow through the first node.

2. The pulse synthesis circuit according to claim 1, further comprising a first inverter circuit having an input terminal connected to the first node.

3. The pulse synthesis circuit according to claim 2, further comprising a switching transistor interposed between the input terminal of the current mirror circuit and the second node, a gate of the switching transistor receiving the output of the first inverter circuit.

4. The pulse synthesis circuit according to claim 2, further comprising a second inverter circuit having an input terminal connected to an output terminal of the first inverter circuit and an output terminal connected to the first node.

5. The pulse synthesis circuit according to claim 2, further comprising a transistor connected between a power supply node and the first node, a gate of the transistor receiving the output of the first inverter circuit.

6. The pulse synthesis circuit according to claim 1, further comprising a data holding circuit connected to the first node for holding an electric charge at the first node.

7. The pulse synthesis circuit according to claim 1, wherein the source of each of the n first drive transistors is continually at a ground potential, and the source of each of the n second drive transistors is continually at the ground potential.

8. A pulse synthesis circuit for synthesizing n first pulse signals and n second pulse signals whose phases are different from one another where n is an integer equal to or greater than 2, comprising:
   n first drive transistors corresponding to the n first pulse signals;
   n second drive transistors corresponding to the n second pulse signals; and
   a current mirror circuit,
   wherein a high-level period of each of the n first pulse signals partially or wholly overlaps a period during which all of the n second pulse signals are at the low level and a high-level period of each of the n second pulse signals partially or wholly overlaps a period during which all of the n first pulse signals are at the low level,
   wherein each of the n first drive transistors includes a source continually at a ground potential, a drain connected to a first node, and a gate receiving a corresponding one of the first pulse signals,
   each of the n second drive transistors includes a source continually at the ground potential, a drain connected to a second node, and a gate receiving a corresponding one of the second pulse signals, and
   the current mirror circuit includes an input terminal connected to the second node, and an output terminal connected to the first node, the current mirror circuit allowing a current corresponding to a current flowing through the second node to flow through the first node.

9. The pulse synthesis circuit according to claim 8, wherein each of the n first drive transistors includes the source directly connected to a ground node, and each of the n second drive transistors includes the source directly connected to the ground node.

10. The pulse synthesis circuit according to claim 9, further comprising a first inverter circuit having an input terminal connected to the first node.

11. The pulse synthesis circuit according to claim 10, further comprising a switching transistor interposed between the input terminal of the current mirror circuit and the second node, a gate of the switching transistor receiving the output of the first inverter circuit.

12. The pulse synthesis circuit according to claim 10 further comprising a second inverter circuit having an input terminal connected to an output terminal of the first inverter circuit and an output terminal connected to the first node.

13. The pulse synthesis circuit according to claim 11, further comprising a transistor connected between a power supply node and the first node, a gate of the transistor receiving the output of the first inverter circuit.

14. The pulse synthesis circuit according to claim 9, further comprising a data holding circuit connected to the first node for holding an electric charge at the first node.

15. The pulse synthesis circuit according to claim 8, wherein a high level period of each of the n first pulse signals does not overlap any high level periods of the n second pulse signals.

16. A pulse synthesis circuit for synthesizing n first pulse signals and n second pulse signals whose phases are different from one another where n is an integer equal to or greater than 2, comprising:
   n first drive transistors corresponding to the n first pulse signals;
   n second drive transistors corresponding to the n second pulse signals; and
   a current mirror circuit,
   wherein a high-level period of each of the n first pulse signals partially or wholly overlaps a period during which all of the n second pulse signals are at the low level and a high-level period of each of the n second pulse signals partially or wholly overlaps a period during which all of the n first pulse signals are at the low level,
   each of the n first drive transistors includes a source connected to a ground node, a drain connected to a first node, and a gate receiving a corresponding one of the first pulse signals,
   each of the n second drive transistors includes a source connected to the ground node, a drain connected to a second node, and a gate receiving a corresponding one of the second pulse signals,
   the current mirror circuit includes an input terminal connected to the second node, and an output terminal connected to the first node, the current mirror circuit allowing a current corresponding to a current flowing through the second node to flow through the first node, and further comprising:
   a first inverter circuit having an input terminal connected to the first node, and
   a switching transistor interposed between the input terminal of the current mirror circuit and the second node, a gate of the switching transistor receiving the output of the first inverter circuit.

* * * * *